United States Patent
Chiu et al.

(10) Patent No.: US 10,581,457 B2
(45) Date of Patent: Mar. 3, 2020

(54) SHIFT COEFFICIENT AND LIFTING FACTOR DESIGN FOR NR LDPC CODE

(71) Applicant: MediaTek Inc., Hsinchu (TW)

(72) Inventors: Mao-Ching Chiu, Chiayi County (TW); Timothy Perrin Fisher-Jeffes, Cambridge, MA (US); Chong-You Lee, Taipei (TW); Cheng-Yi Hsu, Taipei (TW); Yen-Shuo Chang, Hsinchu (TW); Wei-Jen Chen, Taipei (TW); Ju-Ya Chen, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/862,661

(22) Filed: Jan. 5, 2018

(65) Prior Publication Data

US 2018/0198466 A1 Jul. 12, 2018

Related U.S. Application Data

(63) Continuation-in-part of application No. 15/594,239, filed on May 12, 2017, now Pat. No. 10,164,659.
(Continued)

(51) Int. Cl.
*H03M 13/11* (2006.01)
*H03M 13/00* (2006.01)

(52) U.S. Cl.
CPC ...... *H03M 13/1117* (2013.01); *H03M 13/116* (2013.01); *H03M 13/1168* (2013.01);
(Continued)

(58) Field of Classification Search
CPC ............ H03M 13/1117; H03M 13/116; H03M 13/616; H03M 13/1168; H03M 13/6306; H03M 13/6516
(Continued)

(56) References Cited

U.S. PATENT DOCUMENTS

| 7,756,048 B2 | 7/2010 | Ahrens, Jr. et al. |
| 8,225,173 B2 | 7/2012 | Shasha |

(Continued)

FOREIGN PATENT DOCUMENTS

| CN | 101119178 A | 2/2008 |
| CN | 101388743 A | 3/2009 |

(Continued)

OTHER PUBLICATIONS

MediaTek Inc., Implementation considerations of flexible and efficient LDPC decoders, Oct. 10-14, 2016, 3GPP TSG-RAN WG1, pp. 1-8. (Year: 2016).*
(Continued)

*Primary Examiner* — John J Tabone, Jr.
(74) *Attorney, Agent, or Firm* — Han IP PLLC; Andy M. Han

(57) ABSTRACT

Concepts and schemes pertaining to shift coefficient and lifting factor design for NR LDPC code are described. A processor of an apparatus may generate a quasi-cyclic-low-density parity-check (QC-LDPC) code and encode data using the selected codebook. In generating the QC-LDPC code, the processor may define a plurality of sets of lifting factors, generate a respective table of shift values for each lifting factor of the plurality of sets of lifting factors, and generate the QC-LDPC code using a base matrix and the shift coefficient table.

20 Claims, 9 Drawing Sheets

Related U.S. Application Data

(60) Provisional application No. 62/443,852, filed on Jan. 9, 2017, provisional application No. 62/449,677, filed on Jan. 24, 2017.

(52) U.S. Cl.
CPC ..... *H03M 13/616* (2013.01); *H03M 13/6306* (2013.01); *H03M 13/6516* (2013.01)

(58) Field of Classification Search
USPC .......................................... 714/776, 758, 781
See application file for complete search history.

(56) References Cited

U.S. PATENT DOCUMENTS

| | | | |
|---|---|---|---|
| 8,291,283 B1* | 10/2012 | Rad | H03M 13/036 714/752 |
| 8,359,522 B2* | 1/2013 | Gunnam | H03M 13/1177 714/758 |
| 8,418,023 B2* | 4/2013 | Gunnam | H03M 13/1177 714/758 |
| 8,473,817 B2 | 6/2013 | Shen et al. | |
| 8,510,358 B2 | 8/2013 | Yang et al. | |
| 8,555,140 B2* | 10/2013 | Gunnam | H03M 13/1177 714/758 |
| 8,656,250 B2* | 2/2014 | Gunnam | H03M 13/1177 714/758 |
| 8,689,088 B2 | 4/2014 | Lee et al. | |
| 8,768,990 B2* | 7/2014 | Gunnam | G06F 5/017 708/209 |
| 9,432,053 B1* | 8/2016 | Graumann | H03M 13/1111 |
| 9,548,759 B1* | 1/2017 | Rad | H03M 13/116 |
| 9,634,693 B2* | 4/2017 | Pisek | H03M 13/033 |
| 10,090,860 B2* | 10/2018 | Kokubun | H03M 13/2906 |
| 10,164,659 B2* | 12/2018 | Chiu | H04L 1/1819 |
| 2004/0246893 A1 | 12/2004 | Ahrens, Jr. et al. | |
| 2007/0025548 A1 | 2/2007 | Zheng et al. | |
| 2007/0089027 A1 | 4/2007 | Lim et al. | |
| 2007/0211815 A1 | 9/2007 | Pan et al. | |
| 2008/0178065 A1 | 7/2008 | Khandekar et al. | |
| 2008/0276156 A1* | 11/2008 | Gunnam | H03M 13/1177 714/801 |
| 2008/0320353 A1 | 12/2008 | Blankenship et al. | |
| 2010/0146229 A1* | 6/2010 | Yang | G06F 12/0207 711/157 |
| 2010/0257425 A1 | 10/2010 | Yue et al. | |
| 2012/0047415 A1 | 2/2012 | Djordjevic et al. | |
| 2012/0066563 A1 | 3/2012 | Obata et al. | |
| 2012/0084625 A1* | 4/2012 | Pisek | H03M 13/033 714/757 |
| 2012/0089890 A1 | 4/2012 | Palanki et al. | |
| 2012/0240001 A1* | 9/2012 | Abu-Surra | H03M 13/033 714/752 |
| 2012/0257664 A1 | 10/2012 | Yue et al. | |
| 2013/0173994 A1* | 7/2013 | Liu | G06F 5/015 714/769 |
| 2015/0092290 A1* | 4/2015 | Liu | G11B 20/1833 360/47 |
| 2015/0188734 A1 | 7/2015 | Petrov | |
| 2015/0311917 A1 | 10/2015 | Gunnam et al. | |
| 2016/0164537 A1* | 6/2016 | Pisek | H03M 13/116 714/755 |
| 2016/0173132 A1* | 6/2016 | Cho | H03M 13/1154 714/752 |
| 2016/0344502 A1 | 11/2016 | Mouhouche et al. | |
| 2017/0070377 A1 | 3/2017 | Sawahashi et al. | |
| 2017/0134050 A1* | 5/2017 | Abu-Surra | H04B 7/0413 |
| 2017/0141798 A1 | 5/2017 | Kudekar et al. | |
| 2017/0214415 A1* | 7/2017 | Kokubun | H03M 13/2906 |
| 2017/0250712 A1* | 8/2017 | Chiu | H04L 1/1819 |
| 2017/0359148 A1* | 12/2017 | Richardson | H03M 13/1148 |
| 2018/0139758 A1 | 5/2018 | Sankar et al. | |
| 2018/0175886 A1* | 6/2018 | Myung | H03M 13/116 |
| 2018/0226992 A1* | 8/2018 | Panteleev | H03M 13/005 |
| 2018/0246783 A1 | 8/2018 | Avraham et al. | |
| 2018/0294917 A1 | 10/2018 | Loncke et al. | |
| 2018/0331695 A1* | 11/2018 | Fisher-Jeffes | H03M 13/036 |
| 2018/0331698 A1* | 11/2018 | Lee | H03M 13/1168 |
| 2018/0331784 A1* | 11/2018 | Chiu | H04L 1/0058 |
| 2019/0097657 A1* | 3/2019 | Chiu | H04L 1/1819 |

FOREIGN PATENT DOCUMENTS

| | | |
|---|---|---|
| CN | 101741527 A | 6/2010 |
| CN | 101841390 A | 9/2010 |
| CN | 101951264 A | 1/2011 |
| CN | 102237978 A | 11/2011 |
| CN | 101682486 B | 4/2013 |
| CN | 103873186 A | 6/2014 |
| CN | 104917588 A | 9/2015 |
| CN | 105471547 A | 4/2016 |
| CN | 106253912 A | 12/2016 |
| CN | 102904583 B | 6/2017 |
| EP | 1296490 A2 | 3/2003 |
| EP | 1701450 A1 | 9/2006 |
| EP | 2461511 A1 | 6/2012 |
| EP | 2879297 A1 | 6/2015 |
| TW | 200838159 A | 9/2008 |

OTHER PUBLICATIONS

Shin et al., Quasi-cyclic LDPC codes using overlapping matrices and their layered decoders, Oct. 29, 2013, International Journal of Electronics and Communications (AEÜ), pp. 379-383. (Year: 2013).*
State Intellectual Property Office, International Search Report and Written Opinion for International Patent Application No. PCT/CN2018/073963, dated May 2, 2018.
State Intellectual Property Office, International Search Report and Written Opinion for International Patent Application No. PCT/CN2018/089624, dated Aug. 23, 2018.
Mediatek Inc., Multi-codebook embedded compact QC-LDPC design, 3GPP TSG-RAN WG1 NR, Spokane, U.S.A., Aug. 3-7, 2017.
State Intellectual Property Office, International Search Report and Written Opinion for International Patent Application No. PCT/CN2018/093374, dated Sep. 26, 2018.
State Intellectual Property Office, International Search Report and Written Opinion for International Patent Application No. PCT/CN2018/093167, dated Sep. 25, 2018.
ZTE, Discussion on Channel Coding and Modulation for New Radio Interface, 3GPP TSG RAN WG1 #84bis, R1-162229, Apr. 15, 2016, Korea.
State Intellectual Property Office, International Search Report and Written Opinion for PCT Patent Application No. PCT/CN2018/073962, dated Apr. 20, 2018.
State Intellectual Property Office, International Search Report and Written Opinion for PCT Patent Application No. PCT/CN2018/071868, dated Mar. 27, 2018.
Mediatek Inc., Implementation considerations on flexible and efficient LDPC decoders, Lisbon, Portugal, Oct. 10-14, 2016.
ZTE Corp., Consideration on LDPC codes for NR, Nanjing, China, May 23-27, 2016.
Taiwan Intellectual Property Office, Office Action for Taiwan Patent Application No. 106129096, dated Dec. 17, 2018.
Toshihiko Okamura, A Hybrid ARQ Scheme Based on Shortened Low-Density Parity-Check Codes, Wireless Communications and Networking Conference, Mar. 31, 2008, pp. 82-87, XP031243605, ISBN: 978-1-4244-1997-5, WCNC, Piscataway, NJ, USA.
Jong-Ee Oh et al., Row-Splitting Design of Low-Density Parity-Check Codes for Gbps Transmission, Vehicular Technology Conference, Sep. 1, 2007, pp. 1127-1129, XP031147582, ISBN: 978-1-4244-0263-2.
Nokia et al., LDPC Design for eMBB, 3rd Generation Partnership Project, Aug. 12, 2016, pp. 20160822-20160826, vol. RAN WG1, Mobile Competence Center, Gothenburg, Sweden.
Hui Wang et al., On the LLR Criterion Based Shortening Design for LDPC Codes, 2016 Annual Conference on Information Science and Systems, Mar. 16, 2016, pp. 87-92.

(56) References Cited

OTHER PUBLICATIONS

European Patent Office, Partial European Search Report for Application No. 17170825.8-1906, dated Dec. 1, 2017.
Taiwan Intellectual Property Office, Office Action for Taiwan Patent Application No. 107122310 dated Jul. 24, 2019.
Taiwan Intellectual Property Office, Office Action for Taiwan Patent Application No. 107102523, dated Jun. 24, 2019.
Taiwan Intellectual Property Office, Office Action for Taiwan Patent Application No. 107122449, dated Jun. 28, 2019.
USPTO, Office Action for U.S. Appl. No. 15/878,357, dated Aug. 19, 2019.
Taiwan Intellectual Property Office, Office Action for Taiwan Patent Application No. 107102522, dated Oct. 17, 2019.
USPTO, Office Action for U.S. Appl. No. 15/995,093, dated Sep. 17, 2019.

* cited by examiner

| z \ $a_i$ | 2 | 3 | 5 | 7 | 9 | 11 | 13 | 15 |
|---|---|---|---|---|---|---|---|---|
| 0 | 2 | 3 | 5 | 7 | 9 | 11 | 13 | 15 |
| 1 | 4 | 6 | 10 | 14 | 18 | 22 | 26 | 30 |
| 2 | 8 | 12 | 20 | 28 | 36 | 44 | 52 | 60 |
| 3 | 16 | 24 | 40 | 56 | 72 | 88 | 104 | 120 |
| 4 | 32 | 48 | 80 | 112 | 144 | 176 | 208 | 240 |
| 5 | 64 | 96 | 160 | 224 | 288 | 352 | | |
| 6 | 128 | 192 | 320 | | | | | |
| 7 | 256 | 384 | | | | | | |

FIG. 2

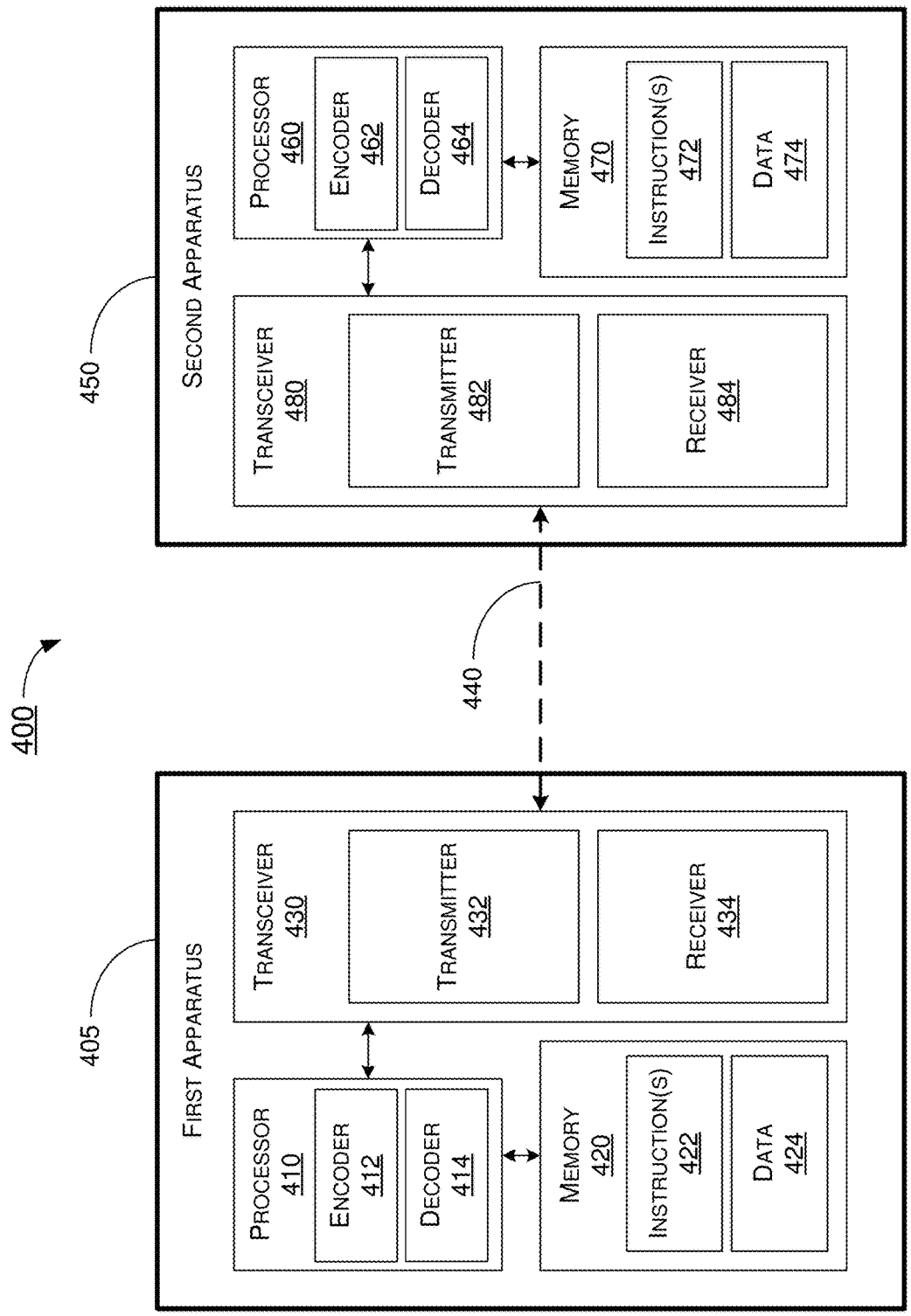

SHIFT COEFFICIENT AND LIFTING FACTOR DESIGN FOR NR LDPC CODE

CROSS REFERENCE TO RELATED PATENT APPLICATIONS

The present disclosure claims the priority benefit of U.S. Provisional Patent Application Ser. No. 62/443,852, filed 9 Jan. 2017, as well as U.S. Provisional Patent Application Ser. No. 62/449,677, filed 24 Jan. 2017, and is a continuation-in-part (CIP) of U.S. patent application Ser. No. 15/594,239, filed 12 May 2017. Contents of the aforementioned patent documents are herein incorporated by reference in their entirety.

TECHNICAL FIELD

The present disclosure is generally related to information coding and decoding and, more particularly, to shift coefficient and lifting factor design.

BACKGROUND

Unless otherwise indicated herein, approaches described in this section are not prior art to the claims listed below and are not admitted as prior art by inclusion in this section.

The $3^{rd}$ Generation Partnership Project (3GPP) has approved plans to speed up the development of the $5^{th}$-generation (5G) New Radio (NR) specifications, it thus can be expected that standards-based 5G NR wireless communications services can be launched in the near future. The 3GPP has also agreed that quasi-cyclic low-density parity-check (QC-LDPC) will be used for in 5G NR data channel. However, specifics are how QC-LDPC-based coding and decoding are not yet defined.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to propose various novel concepts and schemes pertaining to structure design of shift coefficients and lifting factors for QC-LDPC coding and decoding, which can be implemented in next-generation communications, whether wired or wireless, including 5G NR wireless communications.

In one aspect, a method may involve a processor of an apparatus generating a QC-LDPC code. The method may also involve the processor encoding data using the selected codebook. In generating the QC-LDPC code, the method may involve the processor performing the following: (1) defining a plurality of sets of lifting factors; (2) generating a respective table of shift values for each lifting factor of the plurality of sets of lifting factors; and (3) generating the QC-LDPC code using a base matrix and the shift coefficient table.

In one aspect, a method may involve a processor of an apparatus generating a QC-LDPC code. The method may also involve the processor encoding data using the selected codebook. In generating the QC-LDPC code, the method may involve the processor performing the following: (1) defining a plurality of sets of lifting factors; (2) generating a respective table of shift values for each lifting factor of the plurality of sets of lifting factors; and (3) generating the QC-LDPC code using a base matrix and the shift coefficient table. Moreover, in generating the respective table of shift values for each lifting factor of the plurality of sets of lifting factors, the method may involve the processor generating the respective table of shift values for each lifting factor of the plurality of sets of lifting factors using a nested design with a mod operation to represent all shift coefficients of different lifting factors with each set of the plurality sets of lifting factors.

In one aspect, an apparatus may include a processor capable of generating a QC-LDPC code and encoding data using the QC-LDPC code. In generating the QC-LDPC code, the processor may be capable of performing the following: (1) defining a plurality of sets of lifting factors; (2) generating a respective table of shift values for each lifting factor of the plurality of sets of lifting factors; and (3) generating the QC-LDPC code using a base matrix and the shift coefficient table.

It is noteworthy that, although description of the proposed scheme and various examples is provided below in the context of 5G NR wireless communications, the proposed concepts, schemes and any variation(s)/derivative(s) thereof may be implemented in communications in accordance with other protocols, standards and specifications where implementation is suitable. Thus, the scope of the proposed scheme is not limited to the description provided herein.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 2 is a table of an example lifting factor in accordance with an implementation of the present disclosure.

Each of FIG. 3A, FIG. 3B, FIG. 3C

FIG. 4 is a block diagram of an example communications system in accordance with an implementation of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Figure 1:
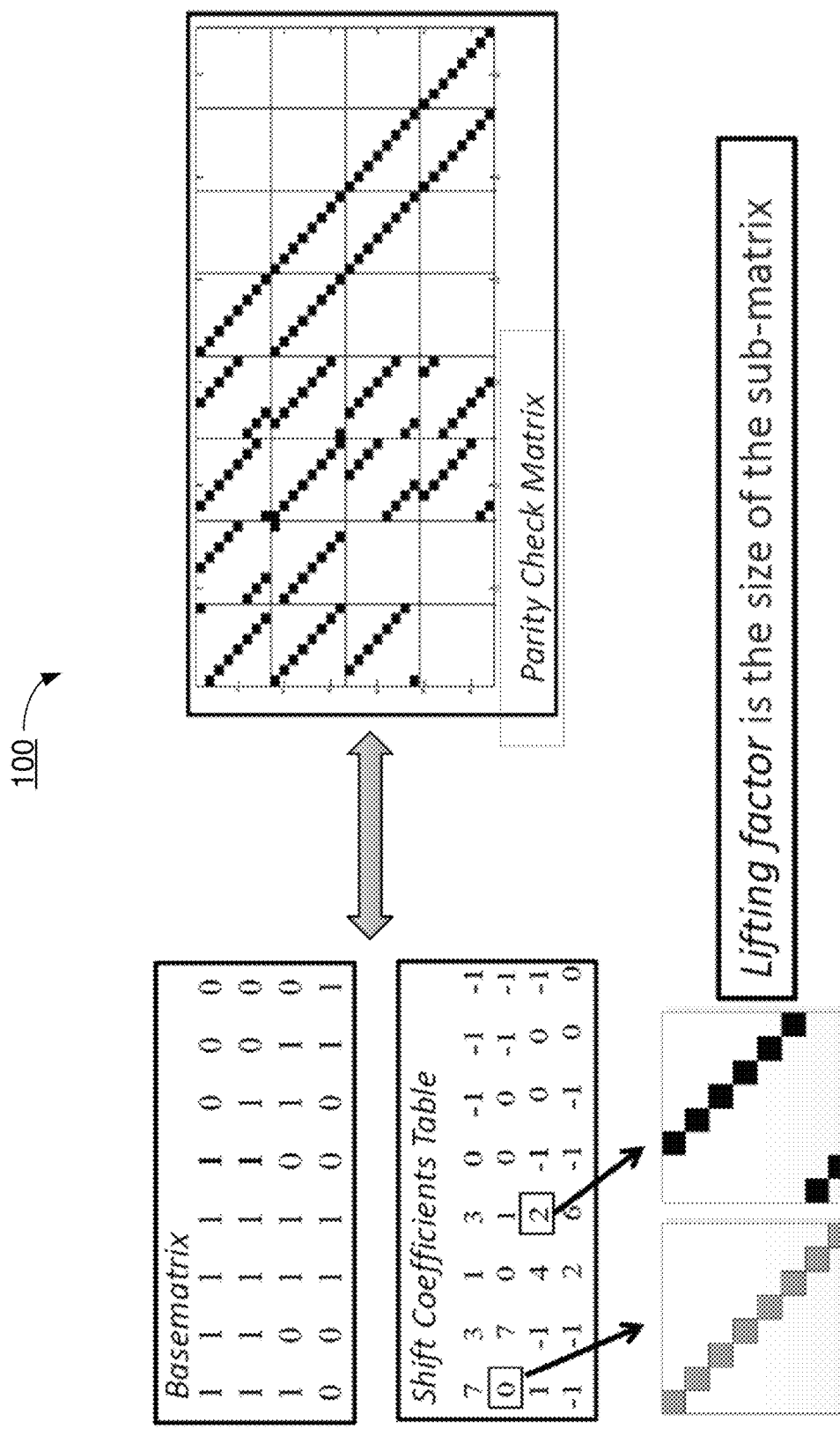
FIG. 1 is a diagram of an example of QC-LDPC code generation in accordance with an implementation of the present disclosure.
Figure 3A:
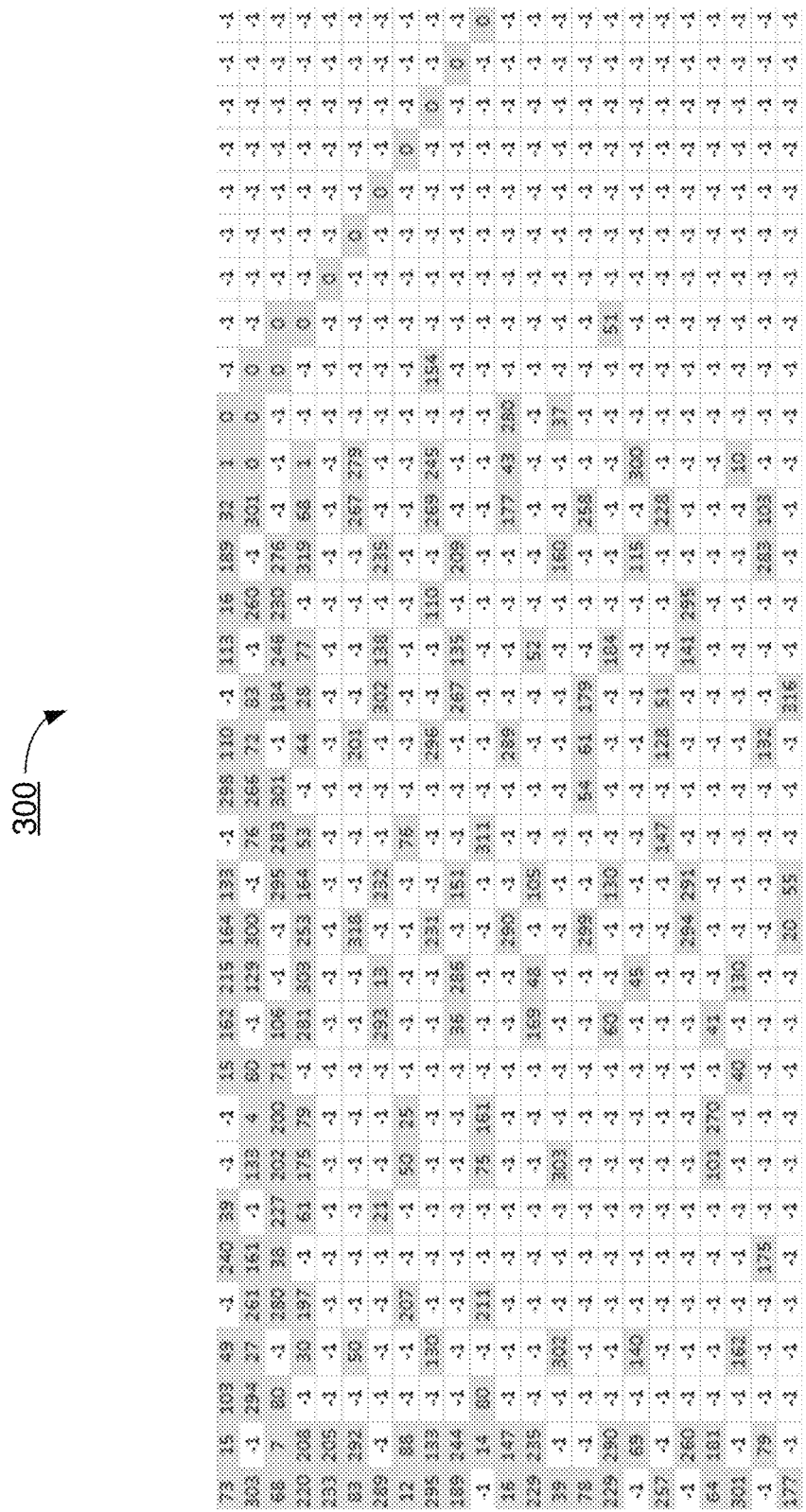
FIG. 3D is a respective quarter portion of an example of a shift coefficient table in accordance with an implementation of the present disclosure.
Figure 3B:
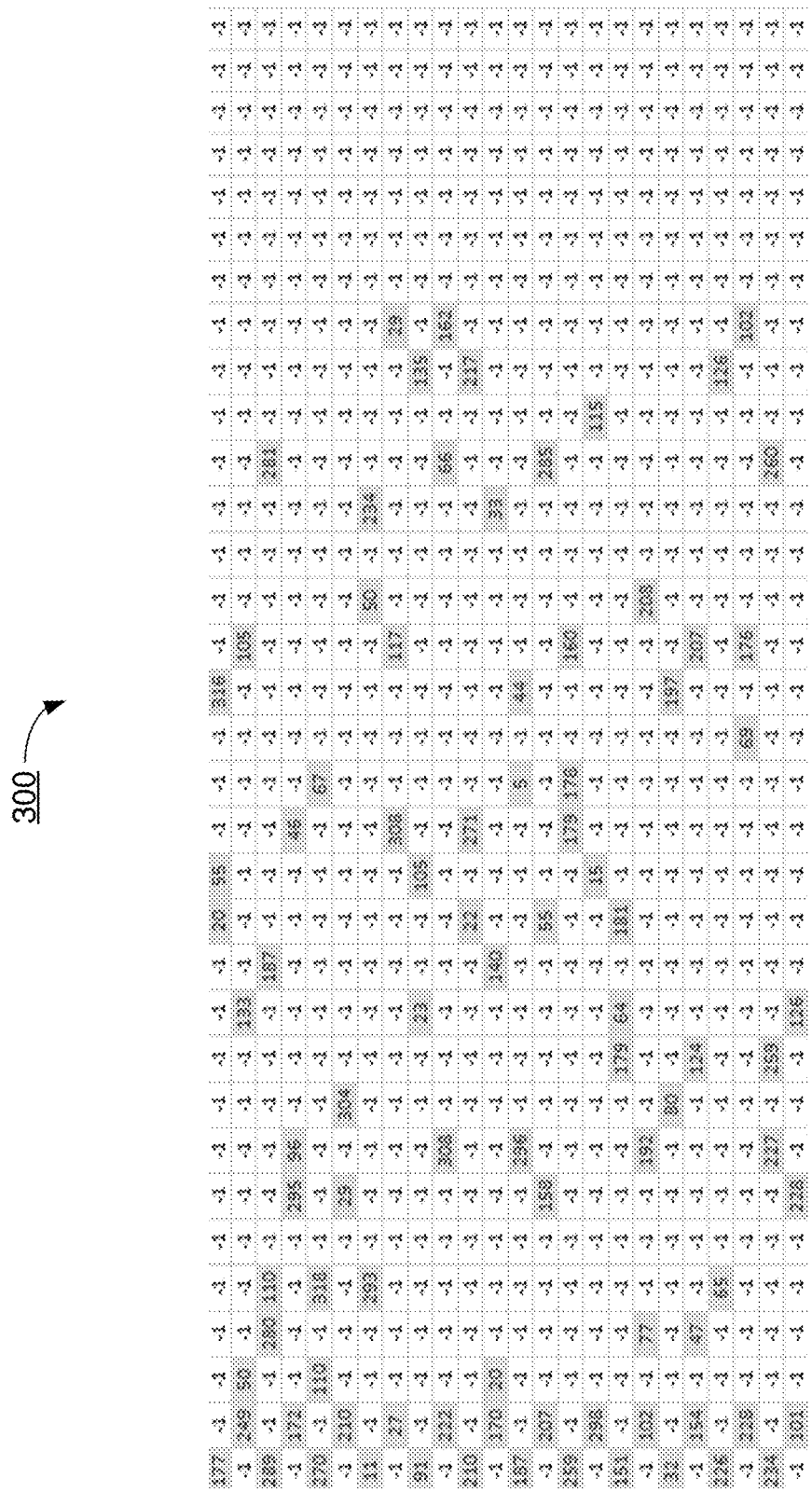
Figure 3C:
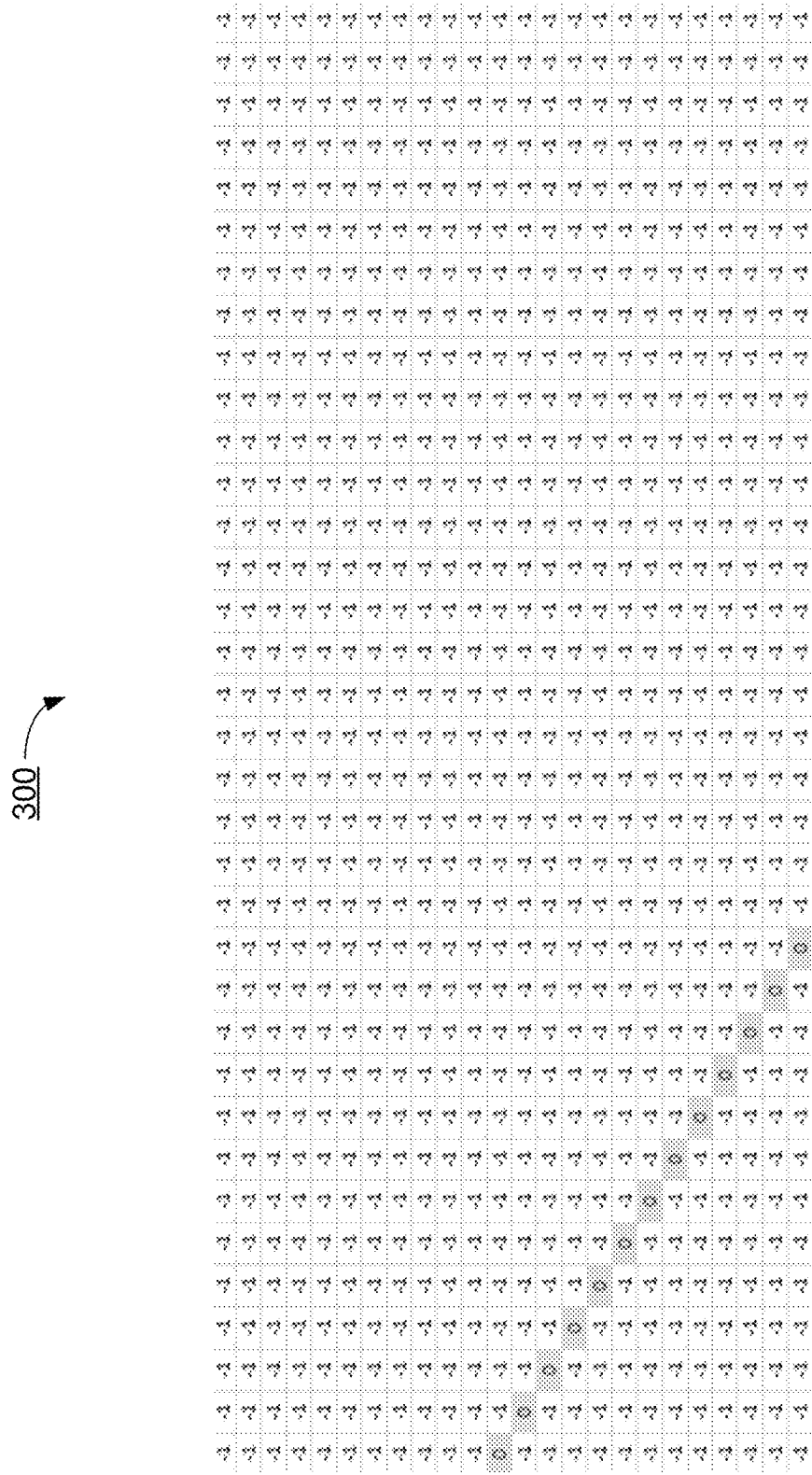
Figure 3D:
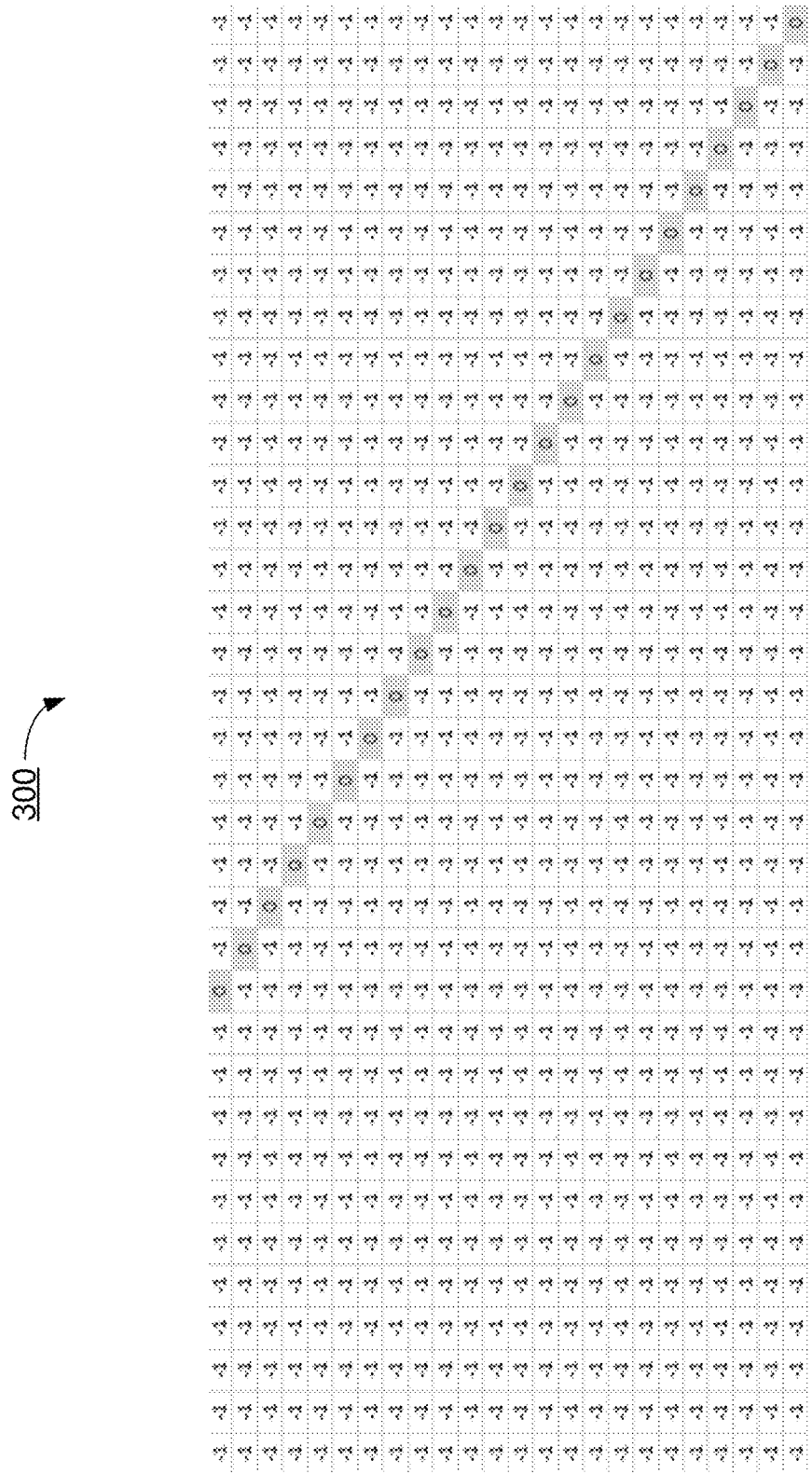

FIG. 1 illustrates an example 100 of QC-LDPC code generation in accordance with an implementation of the present disclosure. FIG. 2 illustrates a table 200 of an example lifting factor in accordance with an implementation of the present disclosure. FIG. 3A-FIG. 3D together illustrate an example 300 of a shift coefficient table in accordance with an implementation of the present disclosure, with FIG. 3A showing an upper-left quarter of the shift coefficient table, FIG. 3B showing a lower-left quarter of the shift coefficient table, FIG. 3C showing an upper-right quarter of the shift coefficient table, and FIG. 3D showing a lower-right quarter of the shift coefficient table. The following description is provided with reference to FIG. 1~FIG. 3D.

Under the proposed concepts and schemes of the present disclosure, a parity check matrix of QC-LDPC code may be constructed from a base matrix and a shift coefficient table, and a lifting factor is the size of a sub-matrix in the parity check matrix. Specifically, valid lifting factors of the proposed QC-LDPC code may comprise a given number of sets of lifting factors (e.g., eight sets), with each set of lifting factors being defined as $a_i \times 2^j$, where i=0~7 for eight sets of lifting factors. For illustrative purposes and without limiting the scope of the present disclosure, table 200 in FIG. 2 is an example of eight sets of lifting factors.

Under the proposed concepts and schemes, each set of the eight sets of lifting factors (Z) may be defined as follows: $Z \in \varphi = \{a \times 2^j\} \forall a \in \{2, 3, 5, 7, 9, 11, 13, 15\}, j \in 0 \sim J$, where: for J=7, a=2~3, for J=6, a=5, for J=5, a=7~11, and for J=4, a=13~15. That is, J denotes the largest valid value that j can be for the corresponding a. Specifically, when a is either 2 or 3, the largest valid value of j is 7; when a is 5, the largest valid value of j is 6; when a is 5, the largest valid value of j is 5; when a is any of 7, 9 and 11, the largest valid value of j is 5; and when a is either 13 or 15, the largest valid value of j is 4. For each lifting factor of the plurality of sets of lifting factors, a respective table of shift values may be generated. For illustrative purposes and without limiting the scope of the present disclosure, example 300 in FIG. 3A-FIG. 3D shows a shift coefficient table for the set of $Z=5 \times 2^j$. In generating the respective table of shift values for each lifting factor of the plurality of sets of lifting factors, the respective table of shift values may be generated to contain a shift coefficient corresponding to a maximal lifting factor with the respective set of lifting factors. In particular, shifting values corresponding to the eight sets of lifting factors may be represented by eight shift coefficient tables which correspond to shift coefficients of {208, 224, 240, 256, 288, 320, 352, 384}. Moreover, in generating the respective table of shift values for each lifting factor of the plurality of sets of lifting factors, each table of shift values may be generated using nested design to represent all shift coefficients of different lifting factors within each set of the eight sets of lifting factors. For instance, for a given lifting factor of $Z=a \times 2^j$ within φ, a corresponding shift coefficient is obtained by: $P_Z^{m,n} = p^{m,n} \mod Z$. Here, $p^{m,n}$ may denote a shift coefficient of (m,n)-th element in the shift coefficient tables for $a \times 2^J$, and J may denote the largest valid value that j may be for the corresponding a. Furthermore, for each lifting factor less than $a \times 2^J$, a corresponding shift value may be obtained by performing a mod operation with Z (e.g., V % Z).

Illustrative Implementations

FIG. 4 illustrates an example communications system 400 in accordance with an implementation of the present disclosure. Communications systems may include a first apparatus 405 and a second apparatus 450, which may be in communications with each other via a communications link 440. Communications link 440 may be a wireless link in some implementations, and may be a wired link in some other implementations. Each of first apparatus 405 and second apparatus 450 may perform various functions as a communication device to implement concepts, schemes, techniques, processes and methods described herein pertaining to shift coefficient and lifting factor design for NR LDPC code, including those described with respect to some or all of FIG. 1-FIG. 3D as well as processes 500 and 600 described below. More specifically, each of first apparatus 405 and second apparatus 450 may implement various aspects of the proposed concepts and schemes pertaining to shift coefficient and lifting factor design for NR LDPC code.

Each of first apparatus 405 and second apparatus 450 may be a part of an electronic apparatus which may be a communication device, a computing apparatus, a portable or mobile apparatus, or a wearable apparatus. For instance, first apparatus 405 may be implemented in a Wi-Fi access point, a smartphone, a smartwatch, a smart bracelet, a smart necklace, a personal digital assistant, or a computing device such as a tablet computer, a laptop computer, a notebook computer, a desktop computer, or a server. Likewise, second apparatus 450 may be implemented in a Wi-Fi mobile client or station, a smartphone, a smartwatch, a smart bracelet, a smart necklace, a personal digital assistant, or a computing device such as a tablet computer, a laptop computer, a notebook computer, a desktop computer, or a server. Alternatively, each of first apparatus 405 and second apparatus 450 may be implemented in the form of one or more integrated-circuit (IC) chips such as, for example and not limited to, one or more single-core processors, one or more multi-core processors, or one or more complex-instruction-set-computing (CISC) processors.

Each of first apparatus 405 and second apparatus 450 may include at least some of those components shown in FIG. 4, respectively. For instance, first apparatus 405 may include at least a processor 410, and second apparatus 450 may include at least a processor 460. Additionally, first apparatus 405 may include a memory 420 and/or a transceiver 430 configured to transmit and receive data wirelessly (e.g., in compliance with one or more 3GPP stands, protocols, specifications and/or any applicable wireless protocols and standards). Each of memory 420 and transceiver 430 may be communicatively and operably coupled to processor 410. Similarly, second apparatus 450 may also include a memory 470 and/or a transceiver 480 configured to transmit and receive data wirelessly (e.g., in compliance with the IEEE 802.11 specification and/or any applicable wireless protocols and standards). Each of memory 470 and transceiver 480 may be communicatively and operably coupled to processor 460. Each of first apparatus 405 and second apparatus 450 may further include other components (e.g., power system, display device and user interface device), which are not pertinent to the proposed scheme of the present disclosure and, thus, are neither shown in FIG. 4 nor described herein in the interest of simplicity and brevity.

Transceiver 430 may be configured to communicate wirelessly in a single frequency band or multiple frequency bands. Transceiver 430 may include a transmitter 432 capable of transmitting data wirelessly and a receiver 434 capable of receiving data wirelessly. Likewise, transceiver 480 may be configured to communicate wirelessly in a single frequency band or multiple frequency bands. Transceiver 480 may include a transmitter 482 capable of transmitting data wirelessly and a receiver 484 capable of receiving data wirelessly.

Each of memory 420 and memory 470 may be a storage device configured to store one or more sets of codes, programs and/or instructions and/or data therein. In the example shown in FIG. 4, memory 420 stores one or more sets of processor-executable instructions 422 and data 424 therein, and memory 470 stores one or more sets of processor-executable instructions 472 and data 474 therein. Each of memory 420 and memory 470 may be implemented by any suitable technology and may include volatile memory and/or non-volatile memory. For example, each of memory 420 and memory 470 may include a type of random access memory (RAM) such as dynamic RAM (DRAM), static RAM (SRAM), thyristor RAM (T-RAM) and/or zero-capacitor RAM (Z-RAM). Alternatively or additionally, memory 520 may include a type of read-only memory (ROM) such as mask ROM, programmable ROM (PROM), erasable programmable ROM (EPROM) and/or electrically erasable programmable ROM (EEPROM). Alternatively or additionally, each of memory 420 and memory 470 may include a type of non-volatile random-access memory (NVRAM) such as flash memory, solid-state memory, ferroelectric RAM (FeRAM), magnetoresistive RAM (MRAM) and/or phase-change memory.

In one aspect, each of processor 410 and processor 460 may be implemented in the form of one or more single-core processors, one or more multi-core processors, or one or more CISC processors. That is, even though a singular term "a processor" is used herein to refer to each of processor 410 and processor 460, each of processor 410 and processor 460 may include multiple processors in some implementations and a single processor in other implementations in accordance with the present disclosure. In another aspect, each of processor 410 and processor 460 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, each of processor 410 and processor 460 is a special-purpose machine specifically designed, arranged and configured to perform specific tasks including QC-LDPC coding with shift coefficient and lifting factor design in accordance with various implementations of the present disclosure.

Processor 410, as a special-purpose machine, may include non-generic and specially-designed hardware circuits that are designed, arranged and configured to perform specific tasks pertaining to QC-LDPC coding with shift coefficient and lifting factor design in accordance with various implementations of the present disclosure. In one aspect, processor 410 may execute the one or more sets of codes, programs and/or instructions 422 stored in memory 420 to perform various operations to render QC-LDPC coding with shift coefficient and lifting factor design in accordance with various implementations of the present disclosure. In another aspect, processor 410 may include an encoder 412 and a decoder 414 that, together, perform specific tasks and functions to render QC-LDPC coding with shift coefficient and lifting factor design in accordance with various implementations of the present disclosure. For instance, encoder 412 may be configured to encode data in accordance with various concepts and schemes of the present disclosure. Similarly, decoder 414 may be configured to decode data in accordance with various concepts and schemes of the present disclosure.

Processor 460, as a special-purpose machine, may include non-generic and specially-designed hardware circuits that are designed, arranged and configured to perform specific tasks pertaining to QC-LDPC coding with shift coefficient and lifting factor design in accordance with various implementations of the present disclosure. In one aspect, processor 460 may execute the one or more sets of codes, programs and/or instructions 472 stored in memory 470 to perform various operations to render power-save operations in accordance with various implementations of the present disclosure. In another aspect, processor 460 may include an encoder 462 and a decoder 464 that performs specific tasks and functions to render QC-LDPC coding with shift coefficient and lifting factor design in accordance with various implementations of the present disclosure. For instance, encoder 462 may be configured to encode data in accordance with various concepts and schemes of the present disclosure. Likewise, decoder 464 may be configured to decode data in accordance with various concepts and schemes of the present disclosure.

Each of first apparatus 405 and second apparatus 450 may be configured to implement each of processes 500 and 600 described below. Thus, to avoid redundancy and in the interest of brevity, operations of first apparatus 405 and second apparatus 450, as well as processor 410 and processor 460, are described below in the context of processes 500 and 600. It is noteworthy that, although the description below is provided in the context of first apparatus 405, the description below is also applicable to second apparatus 450.

Figure 5:
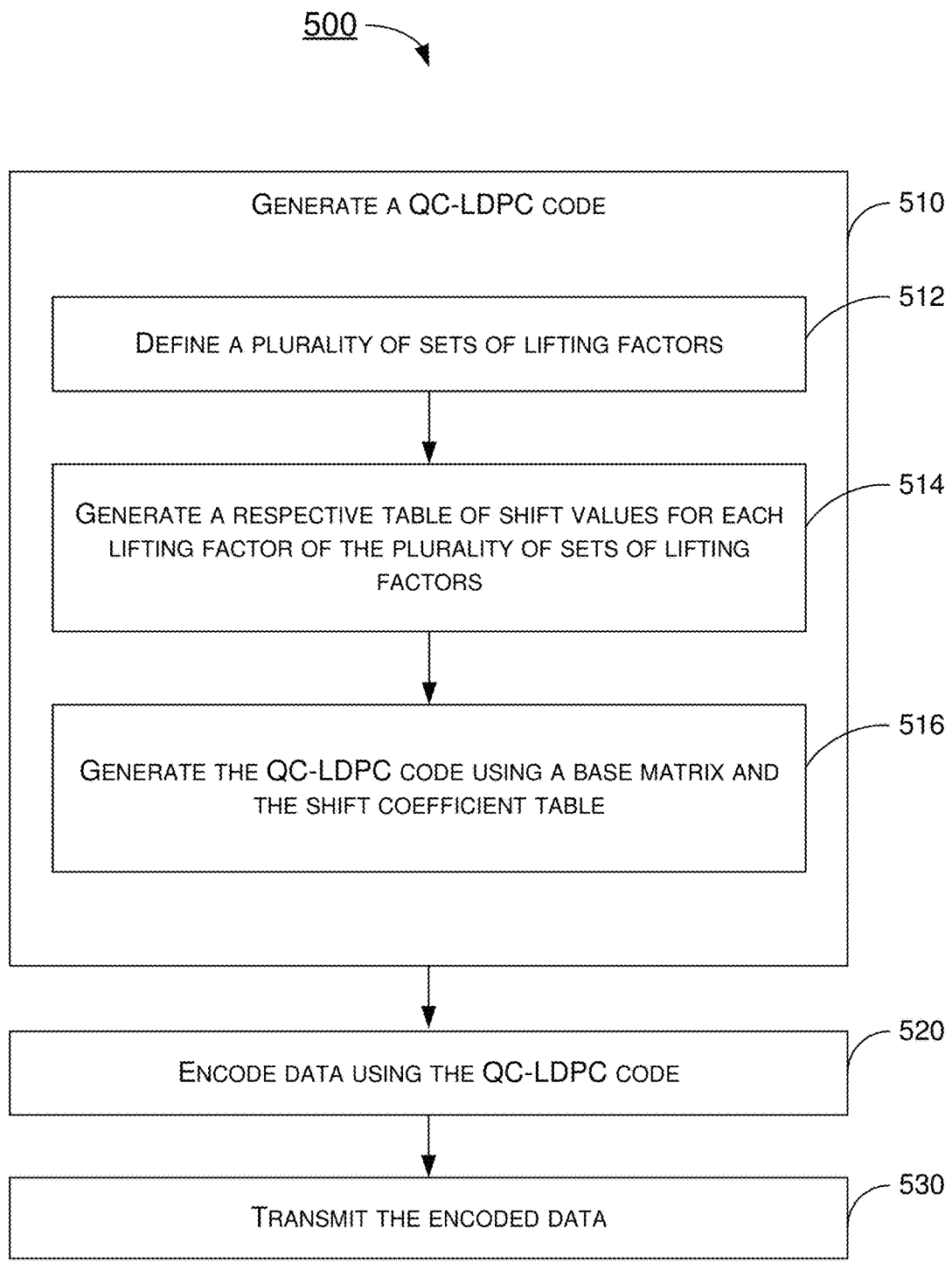
FIG. 5 is a flowchart of an example process in accordance with an implementation of the present disclosure.

FIG. 5 illustrates an example process 500 in accordance with an implementation of the present disclosure. Process 500 may represent an aspect of implementing the proposed concepts and schemes such as those described with respect to some or all of FIG. 1-FIG. 3D. More specifically, process 500 may represent an aspect of the proposed concepts and schemes pertaining to shift coefficient and lifting factor design for NR LDPC code. Process 500 may include one or more operations, actions, or functions as illustrated by one or more of blocks 510, 520 and 530, as well as sub-blocks 512, 514 and 516. Although illustrated as discrete blocks, various blocks of process 500 may be divided into additional blocks, combined into fewer blocks, or eliminated, depending on the desired implementation. Moreover, the blocks/sub-blocks of process 500 may be executed in the order shown in FIG. 5 or, alternatively in a different order. Process 500 may be implemented by communications system 400 and any variations thereof. For instance, process 500 may be implemented in or by first apparatus 405 and/or second apparatus 450. Solely for illustrative purposes and without limiting the scope, process 500 is described below in the context of first apparatus 405. Process 500 may begin at block 510.

At 510, process 500 may involve processor 410 of first apparatus 405 generating a QC-LDPC code. In generating the QC-LDPC code, process 500 may involve processor 410 performing a number of operations as represented by sub-blocks 512, 514 and 516 described below. Process 500 may proceed from 510 to 520.

At 520, process 500 may involve processor 410 encoding data using the QC-LDPC code. Process 500 may proceed from 520 to 530.

At 530, process 500 may involve processor 410 transmitting, via transceiver 430, the encoded data (e.g., to transceiver 480 of apparatus 450).

At 512, process 500 may involve processor 410 defining a plurality of sets of lifting factors. Process 500 may proceed from 512 to 514.

At 514, process 500 may involve processor 410 generating a respective table of shift values for each lifting factor of the plurality of sets of lifting factors. Process 500 may proceed from 514 to 516.

At 516, process 500 may involve processor 410 generating the QC-LDPC code using a base matrix and the shift coefficient table.

In some implementations, the plurality of sets of lifting factors may include eight sets of lifting factors.

In some implementations, in defining the plurality of sets of lifting factors, process 500 may involve processor 410 defining each set of the eight sets of lifting factors (Z) as follows: $Z \in \varphi = \{a \times 2^j\} \forall a \in \{2, 3, 5, 7, 9, 11, 13, 15\}, j \in 0 \sim J$, where: for J=7, a=2~3, for J=6, a=5, for J=5, a=7~11, and for J=4, a=13~15.

In some implementations, in generating the respective table of shift values for each lifting factor of the plurality of sets of lifting factors, process 500 may involve processor 410 generating the respective table of shift values containing a shift coefficient corresponding to a maximal lifting factor with the respective set of lifting factors.

In some implementations, shifting values corresponding to the eight sets of lifting factors may be represented by eight shift coefficient tables which correspond to shift coefficients of {208, 224, 240, 256, 288, 320, 352, 384}.

In some implementations, in generating the respective table of shift values for each lifting factor of the plurality of sets of lifting factors, process 500 may involve processor 410 generating each table of shift values using nested design to represent all shift coefficients of different lifting factors within each set of the eight sets of lifting factors.

In some implementations, for a given lifting factor of $Z=a \times 2^j$ within $\varphi$, a corresponding shift coefficient is obtained by $P_z^{m,n} = p^{m,n} \mod Z$, where $p^{m,n}$ may denote a shift coefficient of (m,n)-th element in the shift coefficient tables for $a \times 2^J$.

In some implementations, for each lifting factor less than $a \times 2^J$, a corresponding shift value may be obtained by performing a mod operation with Z, with J denoting a largest valid value that j can be for a corresponding a.

Figure 6:
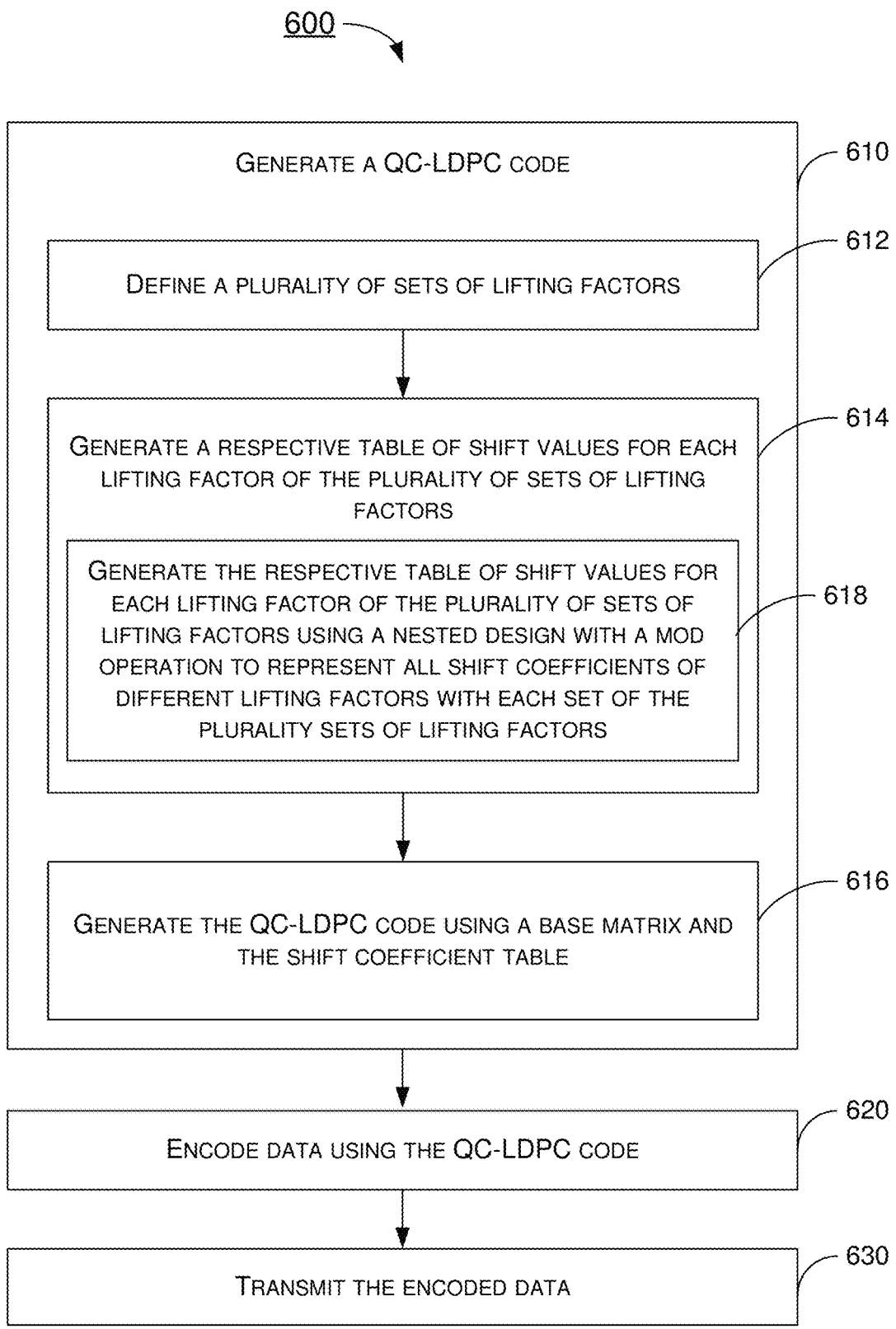
FIG. 6 is a flowchart of an example process in accordance with an implementation of the present disclosure.

FIG. 6 illustrates an example process 600 in accordance with an implementation of the present disclosure. Process 600 may represent an aspect of implementing the proposed concepts and schemes such as those described with respect to some or all of FIG. 1-FIG. 3D. More specifically, process 600 may represent an aspect of the proposed concepts and schemes pertaining to shift coefficient and lifting factor design for NR LDPC code. Process 600 may include one or more operations, actions, or functions as illustrated by one or more of blocks 610, 620 and 630, as well as sub-blocks 612, 614, 616 and 618. Although illustrated as discrete blocks, various blocks of process 600 may be divided into additional blocks, combined into fewer blocks, or eliminated, depending on the desired implementation. Moreover, the blocks/sub-blocks of process 600 may be executed in the order shown in FIG. 6 or, alternatively in a different order. Process 600 may be implemented by communications system 400 and any variations thereof. For instance, process 600 may be implemented in or by first apparatus 405 and/or second apparatus 450. Solely for illustrative purposes and without limiting the scope, process 600 is described below in the context of first apparatus 405. Process 600 may begin at block 610.

At 610, process 600 may involve processor 410 of first apparatus 405 generating a QC-LDPC code. In generating the QC-LDPC code, process 600 may involve processor 410 performing a number of operations as represented by sub-blocks 612, 614 and 616 described below. Process 600 may proceed from 610 to 620.

At 620, process 600 may involve processor 410 encoding data using the QC-LDPC code.

At 630, process 600 may involve processor 410 transmitting, via transceiver 430, the encoded data (e.g., to transceiver 480 of apparatus 450).

At 612, process 600 may involve processor 410 defining a plurality of sets of lifting factors. Process 600 may proceed from 612 to 614.

At 614, process 600 may involve processor 410 generating a respective table of shift values for each lifting factor of the plurality of sets of lifting factors. In generating the respective table of shift values for each lifting factor of the plurality of sets of lifting factors, process 600 may involve processor 410 performing operations as represented by sub-block 618 described below. Process 600 may proceed from 614 to 616.

At 616, process 600 may involve processor 410 generating the QC-LDPC code using a base matrix and the shift coefficient table.

At 618, process 600 may involve processor 410 generating the respective table of shift values for each lifting factor of the plurality of sets of lifting factors using a nested design with a mod operation to represent all shift coefficients of different lifting factors with each set of the plurality sets of lifting factors.

In some implementations, the plurality of sets of lifting factors comprise eight sets of lifting factors.

In some implementations, in defining the plurality of sets of lifting factors, process 600 may involve processor 405 defining each set of the eight sets of lifting factors (Z) as follows: $Z \in \varphi = \{a \times 2^j\} \forall a \in \{2, 3, 5, 7, 9, 11, 13, 15\}, j \in 0 \sim J$, where: for J=7, a=2~3, for J=6, a=5, for J=5, a=7~11, and for J=4, a=13~15.

In some implementations, the respective table may contain a shift coefficient of a maximal lifting factor within the respective set of lifting factors. Moreover, shifting values corresponding to the eight sets of lifting factors may be represented by eight shift coefficient tables which correspond to shift coefficients of {208, 224, 240, 256, 288, 320, 352, 384}.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
generating, by a processor of an apparatus, a quasi-cyclic-low-density parity-check (QC-LDPC) code; and
encoding, by the processor, data using the QC-LDPC code,
wherein the generating of the QC-LDPC code comprises:
defining a plurality of sets of lifting factors represented as Z having lifting factors of $\{a \times 2^j\}$ with a being a positive integer greater than 1 and j being a positive integer;
generating a respective table of shift values for each lifting factor of the plurality of sets of lifting factors; and
generating the QC-LDPC code using a base matrix and a shift coefficient table.

2. The method of claim 1, wherein the plurality of sets of lifting factors comprise eight sets of lifting factors.

3. The method of claim 2, wherein the defining of the plurality of sets of lifting factors comprises defining each set of the eight sets of lifting factors (Z) as:
$Z \in \varphi = \{a \times 2^j\} \forall a \in \{2, 3, 5, 7, 9, 11, 13, 15\}$, $j \in 0 \sim J$, where:
J=7, a=2~3,
J=6, a=5,
J=5, a=7~11, and
J=4, a=13~15.

4. The method of claim 3, wherein the generating of the respective table of shift values for each lifting factor of the plurality of sets of lifting factors comprises generating the respective table of shift values containing a shift coefficient corresponding to a maximal lifting factor with the respective set of lifting factors.

5. The method of claim 4, wherein shifting values corresponding to the eight sets of lifting factors are represented by eight shift coefficient tables which correspond to shift coefficients of {208, 224, 240, 256, 288, 320, 352, 384}.

6. The method of claim 4, wherein the generating of the respective table of shift values for each lifting factor of the plurality of sets of lifting factors comprises generating each table of shift values using a nested design to represent all shift coefficients of different lifting factors within each set of the eight sets of lifting factors.

7. The method of claim 6, wherein for a given lifting factor of $Z=a \times 2^j$ within $\varphi$, a corresponding shift coefficient is obtained by:
$P_Z^{m,n} = p^{m,n} \bmod Z$,
wherein $p^{m,n}$ denotes a shift coefficient of (m,n)-th element in shift coefficient tables for $a \times 2^J$.

8. The method of claim 6, wherein, for each lifting factor less than $a \times 2^J$, a corresponding shift value is obtained by performing a mod operation with Z, and wherein J denotes a largest valid value that j can be for a corresponding a.

9. A method, comprising:
generating, by a processor of an apparatus, a quasi-cyclic-low-density parity-check (QC-LDPC) code; and encoding, by the processor, data using the QC-LDPC code,
wherein the generating of the QC-LDPC code comprises:
defining a plurality of sets of lifting factors represented as Z having lifting factors of $\{a \times 2^j\}$ with a being a positive integer greater than 1 and j being a positive integer;
generating a respective table of shift values for each lifting factor of the plurality of sets of lifting factors; and
generating the QC-LDPC code using a base matrix and a shift coefficient table,
wherein the generating of the respective table of shift values for each lifting factor of the plurality of sets of lifting factors comprises generating the respective table of shift values for each lifting factor of the plurality of sets of lifting factors using a nested design with a mod operation to represent all shift coefficients of different lifting factors with each set of the plurality sets of lifting factors.

10. The method of claim 9, wherein the plurality of sets of lifting factors comprise eight sets of lifting factors.

11. The method of claim 10, wherein the defining of the plurality of sets of lifting factors comprises defining each set of the eight sets of lifting factors (Z) as:
$Z \in \varphi = \{a \times 2^j\} \forall a \in \{2, 3, 5, 7, 9, 11, 13, 15\}, j \in 0 \sim J$, where:
J=7, a=2~3,
J=6, a=5,
J=5, a=7~11, and
J=4, a=13~15.

12. The method of claim 10, wherein the respective table contains a shift coefficient of a maximal lifting factor within the respective set of lifting factors, and wherein shifting values corresponding to the eight sets of lifting factors are represented by eight shift coefficient tables which correspond to shift coefficients of {208, 224, 240, 256, 288, 320, 352, 384}.

13. An apparatus, comprising:
a processor configured to generate a quasi-cyclic-low-density parity-check (QC-LDPC) code and encoding data using the QC-LDPC code,
wherein, in generating the QC-LDPC code, the processor performs operations comprising:
defining a plurality of sets of lifting factors represented as Z having lifting factors of $\{a \times 2^j\}$ with a being a positive integer greater than 1 and j being a positive integer;
generating a respective table of shift values for each lifting factor of the plurality of sets of lifting factors; and
generating the QC-LDPC code using a base matrix and a shift coefficient table.

14. The apparatus of claim 13, wherein the plurality of sets of lifting factors comprise eight sets of lifting factors.

15. The apparatus of claim 14, wherein, in defining the plurality of sets of lifting factors, the processor defines each set of the eight sets of lifting factors (Z) as:
$Z \in \varphi = \{a \times 2^j\} \forall a \in \{2, 3, 5, 7, 9, 11, 13, 15\}, j \in 0 \sim J$, where:
J=7, a=2~3,
J=6, a=5,
J=5, a=7~11, and
J=4, a=13~15.

16. The apparatus of claim 15, wherein, in generating the respective table of shift values for each lifting factor of the plurality of sets of lifting factors, the processor generates the respective table of shift values containing a shift coefficient corresponding to a maximal lifting factor with the respective set of lifting factors.

17. The apparatus of claim 16, wherein shifting values corresponding to the eight sets of lifting factors are represented by eight shift coefficient tables which correspond to shift coefficients of {208, 224, 240, 256, 288, 320, 352, 384}.

18. The apparatus of claim 16, wherein, in generating the respective table of shift values for each lifting factor of the plurality of sets of lifting factors, the processor generates each table of shift values using a nested design to represent all shift coefficients of different lifting factors within each set of the eight sets of lifting factors.

19. The apparatus of claim 18, wherein for a given lifting factor of $Z = a \times 2^j$ within $\varphi$, a corresponding shift coefficient is obtained by:
$P_Z^{m,n} = p^{m,n} \mod Z$,
wherein $p^{m,n}$ denotes a shift coefficient of (m,n)-th element in shift coefficient tables for $a \times 2^J$.

20. The apparatus of claim 18, wherein, for each lifting factor less than $a \times 2^J$, a corresponding shift value is obtained by performing a mod operation with Z, and wherein J denotes a largest valid value that j can be for a corresponding a.

* * * * *